United States Patent
Moon et al.

(10) Patent No.: US 9,786,063 B2
(45) Date of Patent: Oct. 10, 2017

(54) DISPARITY COMPUTATION METHOD THROUGH STEREO MATCHING BASED ON CENSUS TRANSFORM WITH ADAPTIVE SUPPORT WEIGHT AND SYSTEM THEREOF

(71) Applicant: KYUNGPOOK NATIONAL UNIVERSITY INDUSTRY-ACADEMIC COOPERATION FOUNDATION, Daegu (KR)

(72) Inventors: Byung In Moon, Daegu (KR); Kyeong Ryeol Bae, Daegu (KR); Hyeon Sik Son, Daegu (KR); Seung Ho Ok, Busan (KR)

(73) Assignee: KYUNGPOOK NATIONAL UNIVERSITY INDUSTRY—ACADEMIC COOPERATION FOUNDATION, Daegu (KR)

( * ) Notice: Subject to any disclaimer, the term of this patent is extended or adjusted under 35 U.S.C. 154(b) by 399 days.

(21) Appl. No.: 14/587,620

(22) Filed: Dec. 31, 2014

(65) Prior Publication Data
US 2016/0173852 A1 Jun. 16, 2016

(30) Foreign Application Priority Data
Dec. 16, 2014 (KR) .................. 10-2014-0180880

(51) Int. Cl.
H04N 13/00 (2006.01)
G06T 7/593 (2017.01)
H01J 37/22 (2006.01)

(52) U.S. Cl.
CPC ............. *G06T 7/593* (2017.01); *H01J 37/222* (2013.01); *H01J 2237/226* (2013.01); *H01J 2237/2611* (2013.01); *H04N 2013/0081* (2013.01)

(58) Field of Classification Search
CPC ....... H04N 2013/0081; H04N 13/0022; H04N 13/0011; G06T 7/593; H01J 2237/226; H01J 2237/2611; H01J 37/222
USPC ...................................... 348/43–46
See application file for complete search history.

(56) References Cited

U.S. PATENT DOCUMENTS

| | | | | |
|---|---|---|---|---|
| 2004/0026619 A1* | 2/2004 | Oh | ..................... | G01N 23/2251 250/307 |
| 2004/0189674 A1* | 9/2004 | Zhang | ..................... | H04N 1/04 345/629 |
| 2009/0066783 A1* | 3/2009 | Lee | ..................... | H04N 13/0048 348/43 |
| 2010/0328427 A1* | 12/2010 | Sakano | ................... | G06T 7/593 348/43 |
| 2012/0007819 A1* | 1/2012 | Hewes | ............... | H04N 13/0022 345/173 |

(Continued)

*Primary Examiner* — Helen Shibru
(74) *Attorney, Agent, or Firm* — Porzio Bromberg & Newman

(57) ABSTRACT

Provided is a method of computing precise disparity using a stereo matching method based on developed census transform with an adaptive support weight method in area based stereo matching. The method includes a step of setting an adaptive support weight window centered on a specific point of a left image and setting adaptive support weight windows with the same size with respect to one point positioned within a maximum disparity prediction value about a specific point of the left image in a right image.

20 Claims, 8 Drawing Sheets

(56) References Cited

U.S. PATENT DOCUMENTS

| | | | |
|---|---|---|---|
| 2012/0050473 A1* | 3/2012 | Suh | H04N 5/44543 348/43 |
| 2012/0194652 A1* | 8/2012 | Myokan | H04N 13/0022 348/50 |
| 2013/0010069 A1* | 1/2013 | Raju | H04N 19/597 348/46 |
| 2013/0136339 A1* | 5/2013 | Moon | G06K 9/62 382/154 |
| 2013/0170737 A1* | 7/2013 | Arita | H04N 13/0022 382/154 |
| 2013/0222550 A1* | 8/2013 | Choi | H04N 13/025 348/47 |
| 2013/0258067 A1* | 10/2013 | Zhang | H04N 13/0242 348/48 |
| 2014/0112572 A1* | 4/2014 | Reif | G06K 9/6211 382/154 |
| 2014/0254918 A1* | 9/2014 | Cheng | G06K 9/00201 382/154 |
| 2017/0134709 A1* | 5/2017 | Lee | H04N 13/0055 |

* cited by examiner

FIG. 3

Prior Art

| 1 | 1 | 0 | 0 | 0 |
|---|---|---|---|---|
| 1 | 1 | 0 | 0 | 0 |
| 1 | 1 | X | 0 | 0 |
| 0 | 0 | 0 | 1 | 1 |
| 1 | 1 | 1 | 1 | 1 |

Left Hamming weight window

| 1 | 1 | 0 | 0 | 1 |
|---|---|---|---|---|
| 1 | 1 | 0 | 0 | 1 |
| 1 | 1 | X | 0 | 1 |
| 0 | 0 | 0 | 1 | 1 |
| 1 | 1 | 1 | 0 | 0 |

Right Hamming weight window

| 1 | 1 | 1 | 1 | 0 |
|---|---|---|---|---|
| 1 | 1 | 1 | 1 | 0 |
| 1 | 1 | X | 1 | 0 |
| 1 | 1 | 1 | 1 | 1 |
| 1 | 1 | 1 | 0 | 0 |

Hamming bit window (a)

(b)

DISPARITY COMPUTATION METHOD THROUGH STEREO MATCHING BASED ON CENSUS TRANSFORM WITH ADAPTIVE SUPPORT WEIGHT AND SYSTEM THEREOF

CROSS REFERENCE

The present application claims the benefit of Korean Patent Application No. 10-2014-0180880 filed in the Korean Intellectual Property Office on 16 Dec. 2014, the entire contents of which are incorporated herein by reference.

BACKGROUND OF THE INVENTION

1. Field of the Invention

The present invention discloses a method of computing precise disparity using a stereo matching method based on developed census transform with an adaptive support weight method in area based stereo matching.

2. Description of the Related Art

Stereo matching is a technique of acquiring 3-dimensional information from 2-dimensional images acquired at positions different from each other at the same time through two cameras, corresponding points corresponding to the same point are found in left and right images, and disparity information between the two corresponding points is computed, thereby acquiring a depth map that is 3-dimensional distance information.

It has been known that a stereo matching method based on census transformation that is one of stereo matching methods is resistant to an error occurring by difference of gain or bias between two cameras, and is a method easy to be embodied by hardware as compared to other stereo matching methods such as sum of absolute difference (SAD), sum of squared difference (SSD), and normalized correlation (NCC).

FIG. 1 illustrates a stereo matching method based on census transformation using a disparity search range with a regular window size and a regular size in left and right images, FIG. 2 illustrates a method of computing a hamming weight window in a set window, and FIG. 3 illustrates a method of generating a hamming bit window using left and right hamming weight windows.

Referring to FIG. 1, a window centered on a left image point A is set to find a corresponding point of a right image about the left image point A, and a point having the highest correlation in a window area set in the right image about a correlation in a window area set in the left image is found while moving in a window set by the same size from a point B which corresponds to the point A in the right image corresponding thereto to a point B' which is a maximum disparity prediction range, to obtain a disparity value between the left and right image corresponding to the point A.

As another example, in order to find a corresponding point in the right image about a point C, a point having the highest correlation in a regular displacement range from a point D to a point D' is found.

A method for comparison of correlation between the left and right windows will be described with reference to FIG. 2 and FIG. 3.

The census transform is a transformation of generating bit stream information using brightness information of an image in a specific area.

FIG. 2 illustrates a method of computing a hamming weight when a census transform window is set to a 5×5 size, and a hamming weight has to be acquired for each census transform window of the left image and the right image.

A numeral displayed on each cell in a left census transform window in FIG. 2 represents a brightness value when an image is binarized, a size of each pixel is compared on the basis of center data, a value is set to 1 when a brightness value of each pixel is larger than a brightness value of the center point and otherwise is set to 0 to generate a hamming weight window as shown on the right, and a hamming bit stream as shown at a lower part of FIG. 2 is generated.

When each hamming weight window is generated about the left image and the right image, values of corresponding cells between a left image hamming weight window and a right image hamming weight window are compared with each other as shown in FIG. 3, and a hamming bit is set to 1 when two values are equal to each other and is set to 0 when two values are different from each other.

A lower part of FIG. 3 illustrates a hamming bit window, and illustrates that two images further coincides with each other as the number of hamming bits of 1 is increased.

The hamming weight value of a specific point of the left image is compared with the hamming weight values about the window set in the right image to extract a point with the largest number of hamming bits, and a disparity between the points of the left image and the right image corresponding thereto is computed.

Since a stereo matching method based on census transform is to compute a cost for similarity determination according to a window size, it has a characteristic that a matching precision is higher as a window size is larger. Accordingly, there are problems that an amount of computation for finding corresponding points is more rapidly increased as the window size becomes larger, and an amount of computation is a considerable time is consumed to acquire 3-dimensional information.

Meanwhile, an adaptive support weight method by which it is possible to obtain an effect of using windows having various sizes and shapes by putting a difference in each window area has been known.

The adaptive support weight method is a method of computing a weight using a distance from a center pixel and a color difference with respect to each pixel in windows set in a left image and a right image, and then finding a point having the highest correlation in the left and right image windows using an accumulated value of matching costs to which the weight of the left image and the weight of the right image are reflected, and a matching cost (dissimilarity) between a point p in the left image and a point q in the right image is represented as the following equation 1.

$$D_{ASW}(p, p_d) = \frac{\sum_{q \in N_p, q_d \in N_{p_d}} w(p, q) w(p_d, q_d) e(q, q_d)}{\sum_{q \in N_p, q_d \in N_{p_d}} w(p, q) w(p_d, q_d)} \quad [\text{Equation 1}]$$

In the equation 1, a pixel p represents a center pixel of a window, q represents a peripheral pixel in, and $N_p$ and $N_p$ represents corresponding pixels in a left image window and a right image window area, respectively.

$e(q, q_d)$ represents a raw matching cost, and represents an absolute difference in a brightness value between pixels (p, q) of the corresponding left and right images.

$$w(p, q) = \exp\left(-\left(\frac{\Delta c_{pq}}{\gamma_c} + \frac{\Delta p_{pq}}{\gamma_p}\right)\right)$$

represents a weight value, $\gamma_c$ and $\gamma_p$ are constant coefficients, $\Delta c_{pq}$ represents a color similarity between a pixel p and a pixel q, and $\Delta p_{pq}$ represents a distance proximity between a pixel p and a pixel q.

However, the adaptive support weight method has a problem that an amount of computation is rapidly increased and a computation speed is increased, and has a problem that matching cost accuracy is lowered as compared with the census transform method since a brightness absolute difference between pixels is used as a raw matching cost.

In addition, there are a method of using only a specific area in a window designating a specific area for generating a bit stream of census transform using a sparse window shape, and a method of using only a specific area in a window area for computation in the adaptive support weight method. These methods have an advantage of decreasing an amount of computation and improving a computation speed, but have a problem of low accuracy as much. FIG. 4 illustrates an example of various window shapes, and various shapes are used besides the exemplified shapes.

SUMMARY OF THE INVENTION

The present invention has been proposed to solve such problems of the related art, and an object of the invention is to improve a matching speed and to raise a matching accuracy by fusing a method without using a part of a window area and an adaptive support weight method and by using an accumulated matching cost based on a census transform method.

According to an aspect of the invention to achieve the object described above, there is a provided disparity calculation method through stereo matching based on census transform with an adaptive support weight, including: a first step of setting an adaptive support weight window centered on a specific point of a left image, and setting adaptive support weight windows with the same size with respect to one point positioned within a maximum disparity prediction value about a specific point of the left image in a right image; a second step of computing an adaptive support weight for pixels in each of the weight windows of the left image and the right image; a third step of setting a matching window for pixels in the adaptive support weight windows set in the left image and the right image; a fourth step of computing a raw matching cost for pixels in the adaptive support weight windows using the matching window; a fifth step of computing a matching cost using the computed adaptive support weight of each of the computed pixels and the raw matching cost; and a sixth step of computing a matching cost for other points positioned within a maximum disparity prediction value with respect to a specific point of the left image in the right image, and then computing a disparity value through comparison of the computed matching costs.

According to another preferred aspect of the invention, there is provided a disparity computation system through stereo matching based on census transform with an adaptive support weight, including: a weight computation unit that computes an adaptive support weight for pixels in an adaptive support weight window set in each of a left image and a right image; a census transform unit that sets a matching window for pixels in an adaptive support weight window, and computes a raw matching cost for pixels in an adaptive support weight window using the matching window; a matching cost computation unit that computes a matching cost using the computed adaptive support weight of pixels and the raw matching cost; and a disparity computation unit that computes matching costs for other points positioned within a maximum disparity prediction value with respect to a specific point of the left image in the right image, and then computes a disparity value through comparison of the computed matching costs.

BRIEF DESCRIPTION OF THE DRAWINGS

The above and other objects, features and advantages of the present invention will be more apparent from the following detailed description taken in conjunction with the accompanying drawings, in which:

FIG. 3 illustrates a method of generating a hamming bit window using left and right hamming weight windows;

DETAILED DESCRIPTION OF THE PREFERRED EMBODIMENT

Hereinafter, a preferred embodiment of the invention will be described in detail with reference to the accompanying drawings.

Figure 1:
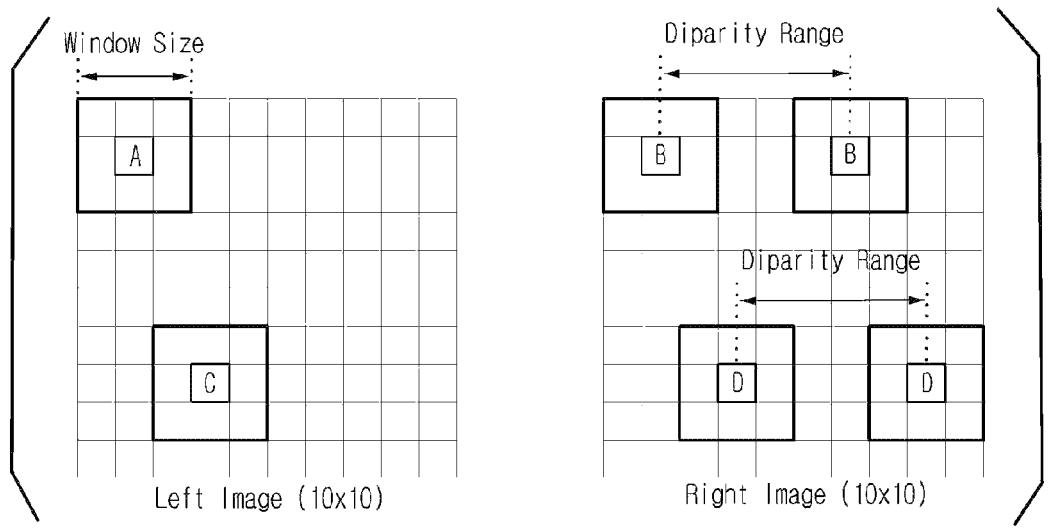
FIG. 1 illustrates a stereo matching method based on census transform using a disparity search range with a regular window size and a regular size in left and right images.
Figure 2:
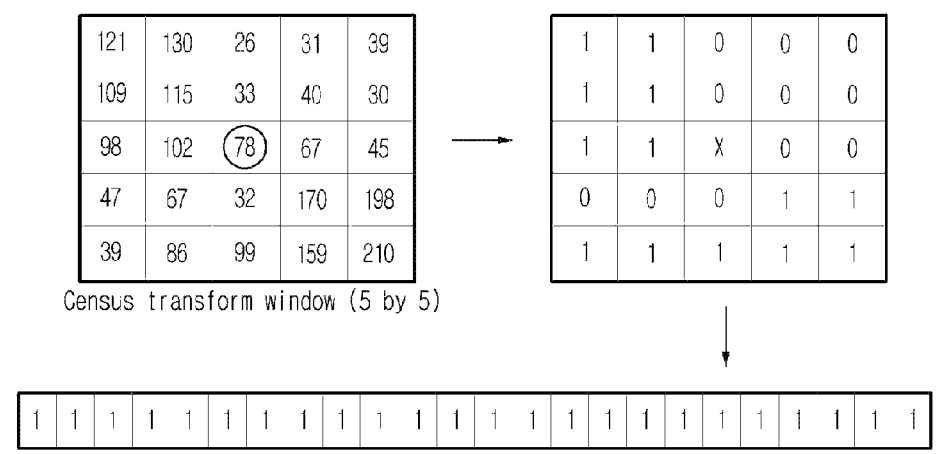
FIG. 2 illustrates a method of computing a hamming weight window in a set window.
Figure 4:
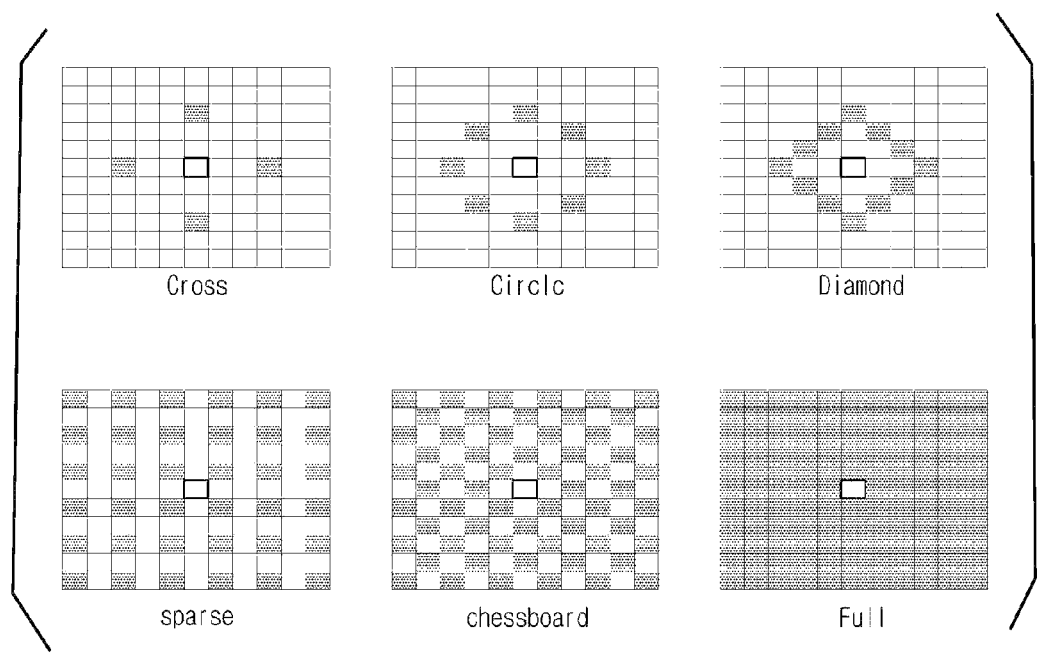
FIG. 4 is a diagram illustrating various examples of window shapes used in matching cost computation.
Figure 5:
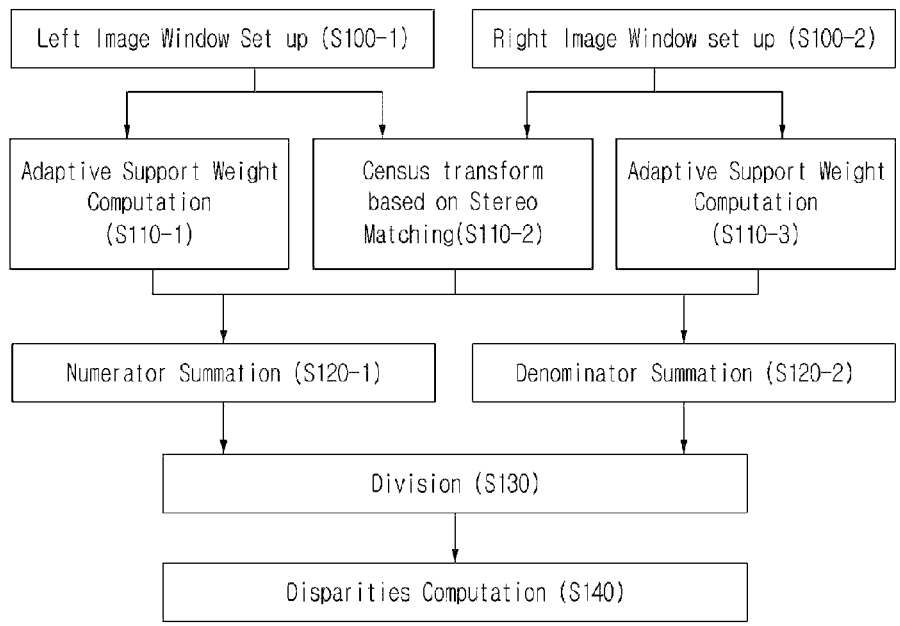
FIG. 5 is a flowchart illustrating a process of performing a disparity computation method through stereo matching based on census transform with an adaptive support weight according to the invention.
Figure 6:
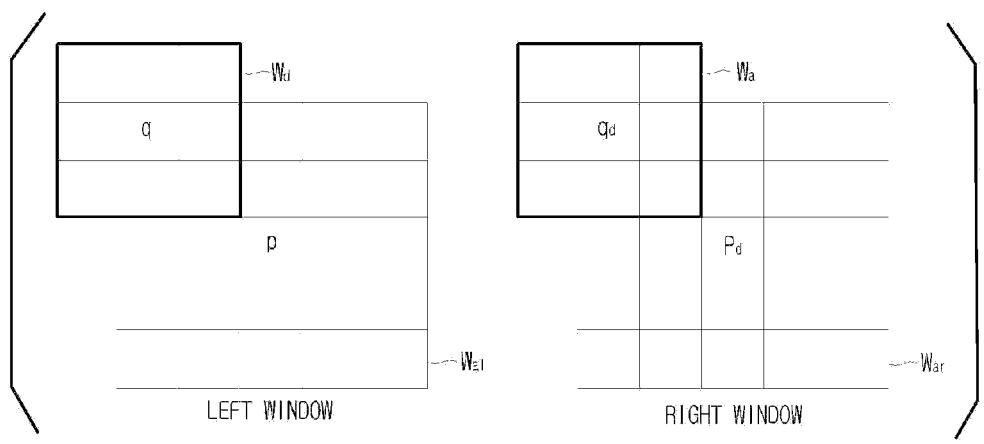
FIG. 6 is a diagram for explaining a method of acquiring disparity information with high reliability by fusing a stereo matching method and an adaptive support weight method according to an embodiment of the invention.
Figure 7:
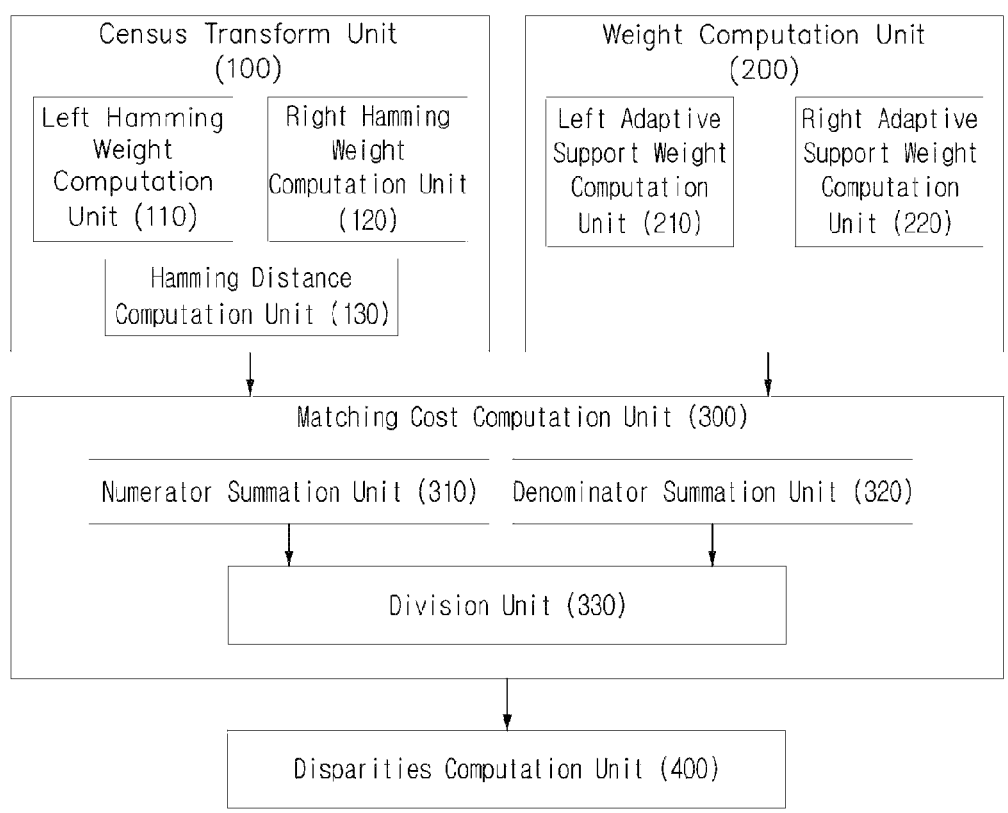
FIG. 7 is a block diagram illustrating a configuration of a disparity computation system through stereo matching based on census transform with an adaptive support weight according to the invention.
Figure 8:
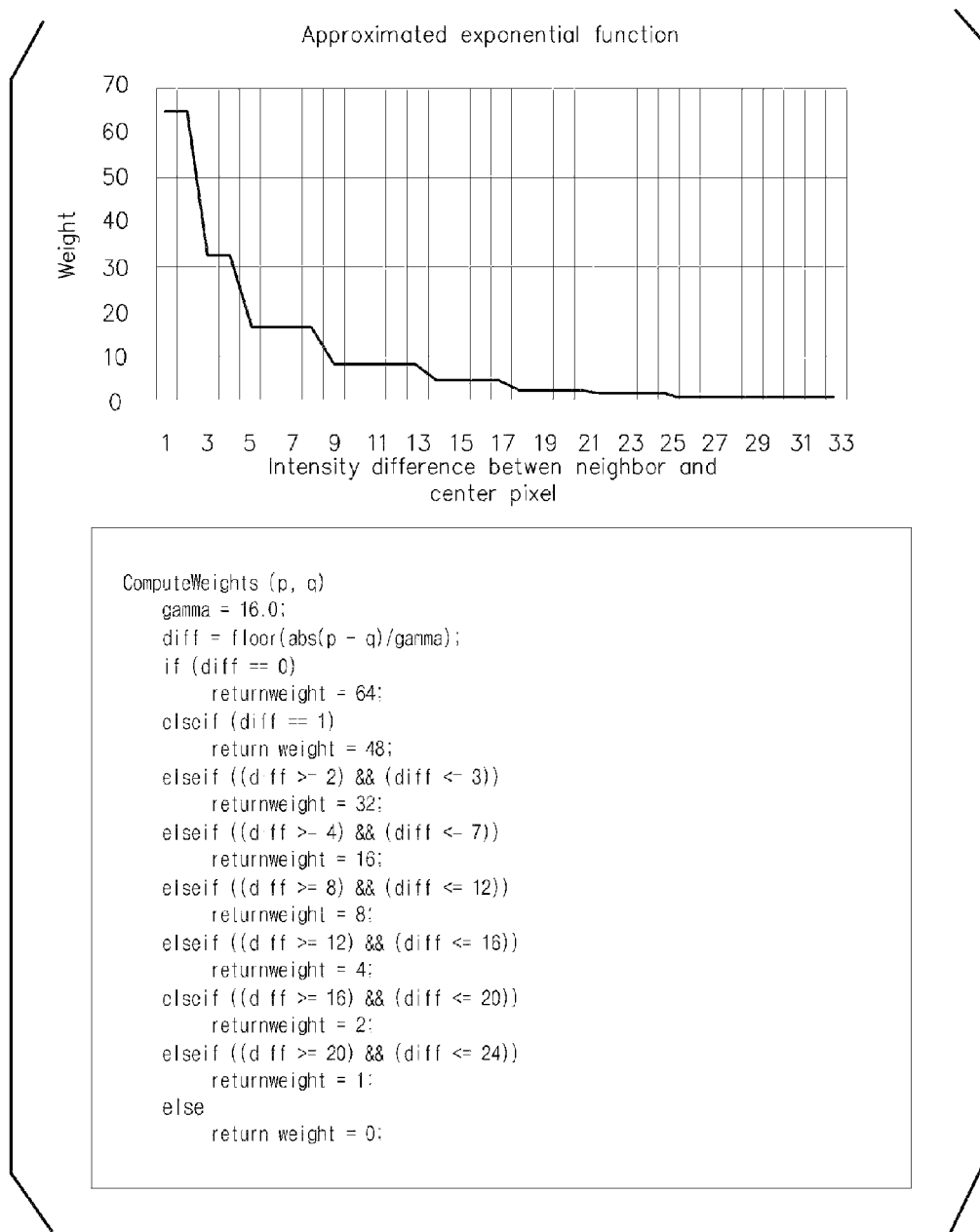
FIG. 8 illustrates a weight value based on a brightness difference according to an embodiment of the invention, and a pseudo code for acquiring the weight value.

FIG. 5 is a flowchart illustrating a process of performing a disparity computation method through stereo matching based on census transform with an adaptive support weight according to the invention, FIG. 6 is a diagram for explaining a method of acquiring disparity information with high reliability by fusing a stereo matching method based on census transform and an adaptive support weight method according to the embodiment of the invention, FIG. 7 is a block diagram illustrating a configuration of a disparity computation system through stereo matching based on census transform with an adaptive support weight according to the invention, and FIG. 8 illustrates a weight value based on a brightness difference and a pseudo code for acquiring the weight value according to the embodiment of the invention.

Hereinafter, a method of acquiring disparity information with high reliability by fusing a stereo matching method based on census transform and an adaptive support weight method according to the invention will be described with reference to FIG. 5.

First, a window for computing a matching cost is set in each of a left image and a right image (S100-1 and S100-2). As shown in FIG. 6, in order to find a point of the right image corresponding to a specific point P of the left image, an adaptive support weight window ($W_{al}$, hereinafter, referred to as "weight window") centered on the specific point P of the left image is set. In an embodiment of FIG. 6, the weight window $W_{al}$ with 5×5 size is exemplified. A weight window $W_{ar}$ with the same size is set for one point $P_d$ positioned within a maximum disparity prediction value with respect to the point P of the left image in the right image.

When the weight windows $W_{al}$ and $W_{ar}$ are set in the left image and the right image, respectively, adaptive support weights (hereinafter, referred to as "weight") are computed for all the pixels in each of the windows $W_{al}$ and $W_{ar}$ (S110-1 and S110-3).

In the invention, only a brightness value difference is used to reduce an operation for weight computation, and the weight is computed by the following equation 2.

$$w(p, q) = \exp\left(-\frac{\Delta p_{pq}}{\gamma_p}\right) \qquad \text{[Equation 2]}$$

$\gamma_p$: constant coefficient
$\Delta p_{pq}$: difference of brightness values of cells That is, it can be known that the weight is exponential-functionally decreased as the brightness difference the center pixel P and adjacent pixels gets larger, and a weight computation function can be embodied by a simple pseudo code shown in FIG. 8. In the weight computation function shown in FIG. 8, the weight is exponentially decreased from the maximum 64 to 0.

The weights are computed for all the pixels in the weight windows $W_{al}$ and $W_{ar}$ in the left image and the right image using the equation 2. Such computation can be embodied by hardware, and in order thereto, the disparity computation system according to the invention may include a weight computation unit 200 including a left adaptive support weight computation unit 210 and a right adaptive support weight computation unit 220.

Simultaneously with the weight computation, census transform based on stereo is performed (S110-2). As described above, the weight computation and the census transform of the left image and the right image are simultaneously performed in parallel, and thus there is an advantage of shortening computation time.

For all the pixels in the weight windows $W_{al}$ and $W_{ar}$ set in the left image and the right image for the census transform based on stereo, matching windows $W_{cl}$ and $W_{cr}$ for acquiring a raw matching cost are set.

In FIG. 6, the matching window $W_{cl}$ with a regular size (3×3 in the embodiment) is set for the pixels in the left weight window $W_{al}$, and the matching window $W_{cr}$ with the same size is also set for the corresponding pixels in the right weight window $W_{ar}$. FIG. 6 illustrates that the matching windows $W_{cl}$ and $W_{ar}$ are set for the pixel q in the left weight window $W_{al}$ and the pixel $q_d$ which is the corresponding pixel in the right weight window $W_{ar}$, respectively.

The stereo matching method based on census transform is applied to the left matching window $W_{cl}$ and the right matching window $W_{cr}$ to compute a raw matching cost between the pixel q in the weight window $W_{al}$ and the pixel $q_d$ which is the corresponding pixel in the right weight window $W_{ar}$. Such computation may be embodied by hardware, and in order thereto, the disparity computation system according to the invention may include a census transform unit 100 including a left hamming weight computation unit 110, a right hamming weight computation unit 120, and a hamming distance computation unit 130.

In the description, when the weight and the raw matching cost are computed for the left and right images, $D_{ASW}(p, p_d)$ is computed as a matching cost using the following equation 3.

$$D_{ASW}(p, p_d) = \frac{\sum\limits_{q \in N_p, q_d \in N_{p_d}} w(p, q) w(p_d, q_d) e(q, q_d)}{\sum\limits_{q \in N_p, q_d \in N_{p_d}} w(p, q) w(p_d, q_d)} \qquad \text{[Equation 3]}$$

Herein, $N_p$ and $N_{pd}$ are the corresponding pixels in the left image window and the right image window area, respectively, and $e(q, q_d)$ represents a raw matching cost computed through the stereo matching based on census transform differently from the equation 1 according to the related art.

The process of computing the matching cost using the equation 3 is performed through the process (S120-1) of summing the numerators of the equation 3, the process of (S120-2) of summing the denominators of the equation 3, and then the process (S130) of dividing the summed numerator value by the denominator value. Such a process of summing and dividing the numerator and denominator value can be embodied by hardware, and in order thereto, the disparity computation system according to the invention may include a matching cost computation unit 300 including a numerator summation unit 310, a denominator summation unit 320, and a division unit 330.

It is possible to improve an operation speed by also simultaneously performing the numerator computation process (S120-1) and the denominator computation process (S120-2).

The matching costs described above are computed for the point p of the left image and all the points in the maximum disparity prediction range corresponding to the point p in the right image, and then a disparity value is computed through comparison of the computed matching costs (S140). Such disparity computation can also be embodied by hardware, and the disparity computation system according to the invention may include a disparity computation unit 400.

Figure 9A:
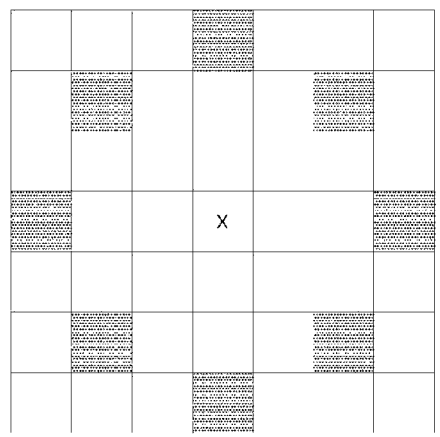
FIG. 9A and FIG. 9B are diagrams illustrating examples of various window shapes according to an embodiment of the invention.
Figure 9B:
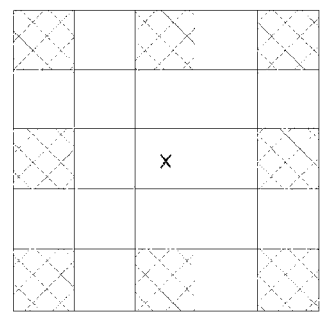
Figure 10:
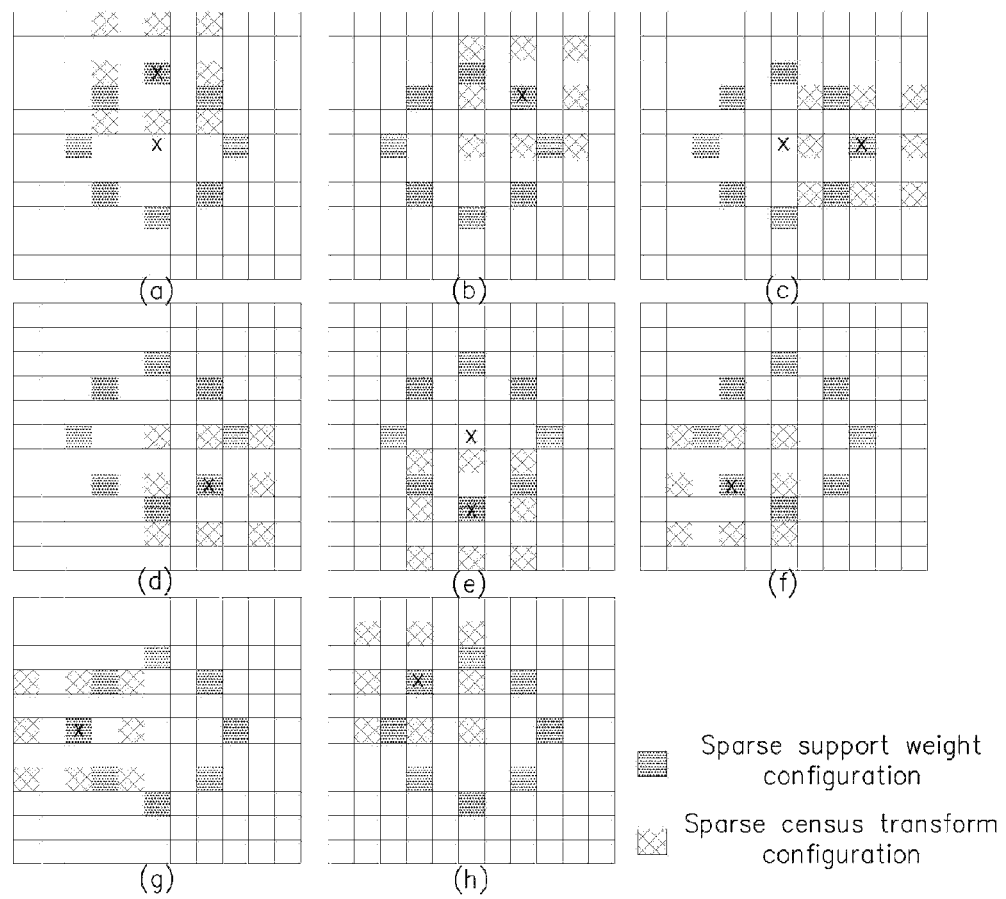
FIG. 10 is a diagram illustrating a use method of an adaptive support weight window and a matching window for stereo matching based on census transform according to an embodiment of the invention.

FIG. 9A and FIG. 9B are diagrams illustrating examples of various window shapes according to a modified embodiment of the invention, and FIG. 10 is a diagram illustrating a method of using a weight window and a matching window according to the modified embodiment of the invention.

FIG. 9A illustrates an example of a sparse weight window, FIG. 9B illustrates an example of a sparse matching window, and the modified embodiment of the invention is characterized in that a part of a window area is not used in stereo matching and weight computation.

More specifically, FIG. 9A illustrates a circle weight window representing the use of eight points in a window with 7×7 size, and FIG. 9B illustrates a sparse matching window representing the use of eight points in a window with 5×5 size. The weight window determines whether or not to use the window area used in the weight computation processes (S110-1 and S110-2), and the matching window determines whether or not to use the window area used in the census transform process (S110-2).

That is, in the equation 3, Np and Npd represent selected pixels in the left and right sparse window areas, and it is possible to reduce computation time by performing census transformation and the weight computation only for selected pixels.

FIG. 10 illustrates a method of computing a matching cost using the weight window and the matching window exemplified in FIG. 9, the matching window is set only for selected pixels preset in the weight window, the stereo matching based on census transform is performed, and operation time is reduced through a process of performing census transformation only for selected pixels preset in the matching window which also applies to stereo matching based on census transform.

According to the invention described above, it is possible to improve matching accuracy by combining the stereo matching based on census transform and the adaptive support weight method and at the same time it is also possible to prevent a rapid increase of the amount of computation by restricting the use pixels in the window area, and thus there is an advantage of achieving a high computation speed and a high matching degree.

In addition, it is possible to raise the computation speed by simultaneously performing the weight computation and the process of the stereo matching based on census transform and by simultaneously performing the numerator computation and the denominator computation in the matching cost computation process.

As described above, the preferred embodiment has been disclosed in the drawings and specification. Herein, the specific terms have been used, but have been used to merely describe the invention, and have not been used to restrict meaning or to restrict the scope of the invention described in the claim. Therefore, a person skilled in the art can understand that various modifications and other equivalent embodiments can be achieved from this. Accordingly, a real technical protective scope of the invention should be determined by a technical sprit of the accompanying claim.

What is claimed is:

1. A disparity calculation method through stereo matching based on census transform with an adaptive support weight, the method comprising:
   a first step of setting an adaptive support weight window centered on a specific point of a left image and setting adaptive support weight windows with the same size with respect to one point positioned within a maximum disparity prediction value about a specific point of the left image in a right image;
   a second step of computing an adaptive support weight for pixels in each of the weight windows of the left image and the right image;
   a third step of setting a matching window for pixels in the adaptive support weight windows set in the left image and the right image;
   a fourth step of computing a raw matching cost for pixels in the adaptive support weight windows using the matching window;
   a fifth step of computing a computed matching cost using the computed adaptive support weight and the raw matching cost; and
   a sixth step of computing a matching cost for other points positioned within a maximum disparity prediction value with respect to a specific point of the left image in the right image, and then computing a disparity value through comparison of the computed matching cost.

2. The disparity calculation method through stereo matching based on census transform with an adaptive support weight according to claim 1, wherein the adaptive support weight is computed using a difference in a brightness value between a center pixel and other pixels of the adaptive support weight window.

3. The disparity calculation method through stereo matching based on census transform with an adaptive support weight according to claim 2, wherein the adaptive support weight is computed by the following equation, $$w(p, q) = \exp\left(-\frac{\Delta p_{pq}}{\gamma_p}\right)$$

where, $\gamma_p$ is a constant coefficient, and $\Delta p_{pq}$ is a difference of brightness values of cells.

4. The disparity calculation method through stereo matching based on census transform with an adaptive support weight according to claim 1, wherein the first and second steps and the third and fourth steps are simultaneously performed in parallel.

5. The disparity calculation method through stereo matching based on census transform with an adaptive support weight according to claim 1, wherein the raw matching cost is computed through the stereo matching based on census transform.

6. The disparity calculation method through stereo matching based on census transform with an adaptive support weight according to claim 5, wherein in the fifth step, the matching cost is computed by the following equation, $$D_{ASW}(p, p_d) = \frac{\sum_{q \in N_p, q_d \in N_{p_d}} w(p, q)w(p_d, q_d)e(q, q_d)}{\sum_{q \in N_p, q_d \in N_{p_d}} w(p, q)w(p_d, q_d)}$$

Where, $N_p$ and $N_{pd}$ are corresponding pixels in the left image window and the right image window, respectively, and $e(q, q_d)$ is a raw matching cost computed through the stereo matching based on census transform.

7. The disparity calculation method through stereo matching based on census transform with an adaptive support weight according to claim 6, wherein the fifth step of computing the matching cost using the equation includes a fifth-1 step of summing numerators of the equation 3, a fifth-2 step of summing denominators of the equation 3, and a fifth-3 step of dividing a value of the summed numerators by a value of the summed denominators.

8. The disparity calculation method through stereo matching based on census transform with an adaptive support weight according to claim 7, wherein the fifth-1 step and the fifth-2 step are simultaneously performed in parallel.

9. The disparity calculation method through stereo matching based on census transform with an adaptive support weight according to claim 1, wherein the adaptive support weight window and the matching window are sparse-type windows using only selected pixels in a window area.

10. The disparity calculation method through stereo matching based on census transform with an adaptive support weight according to claim 9, wherein the adaptive support weight window and the matching window are different types of sparse-type windows.

11. A disparity computation system through stereo matching based on census transform with an adaptive support weight, the system comprising:
- a weight computation unit that computes an adaptive support weight for pixels in an adaptive support weight window set in each of a left image and a right image;
- a census transformation unit that sets a matching window for pixels in the adaptive support weight window, and computes a raw matching cost for pixels in the adaptive support weight window using the matching window;
- a matching cost computation unit that computes a matching cost using the computed adaptive support weight of pixels and the raw matching cost; and
- a disparity computation unit that computes matching costs for other points positioned within a maximum disparity prediction value with respect to a specific point of the left image in the right image, and then computes a disparity value through comparison of the computed matching costs.

12. The disparity computation system through stereo matching based on census transform with an adaptive support weight according to claim 11, wherein the weight computation unit includes a left adaptive support weight computation unit that computes an adaptive support weight for pixels in a left adaptive support weight window, and a right adaptive support weight computation unit that computes an adaptive support weight for pixels in a right adaptive support weight window.

13. The disparity computation system through stereo matching based on census transform with an adaptive support weight according to claim 11, wherein the census transformation unit includes a left hamming weight computation unit that computes a hamming weight using a brightness difference between a center pixel and other pixels in the left matching window, a right hamming weight computation unit that computes a hamming weight using a brightness difference between a center pixel and other pixels in the right matching window, and a hamming distance computation unit that computes a hamming distance using the computed left hamming weight and right hamming weight.

14. The disparity computation system through stereo matching based on census transform with an adaptive support weight according to claim 11, wherein the matching cost computation unit that computes the matching cost by the following equation, $$D_{ASW}(p, p_d) = \frac{\sum_{q \in N_p, q_d \in N_{p_d}} w(p, q) w(p_d, q_d) e(q, q_d)}{\sum_{q \in N_p, q_d \in N_{p_d}} w(p, q) w(p_d, q_d)}$$

where, $N_p$ and $N_{pd}$ are corresponding pixels in the left image window and the right image window, respectively, and $e(q, q_d)$ is a raw matching cost computed through the stereo matching based on census transform.

15. The disparity computation system through stereo matching based on census transform with an adaptive support weight according to claim 14, wherein the matching cost computation unit includes a numerator summation unit that performs sums the numerator values of the equation, a denominator summation unit that sums the denominator values of the equation, and a division unit that divides the numerator sum value by the denominator sum value.

16. The disparity computation system through stereo matching based on census transform with an adaptive support weight according to claim 11, wherein the weight computation unit and the census transformation unit are simultaneously driven in parallel.

17. The disparity computation system through stereo matching based on census transform with an adaptive support weight according to claim 14, wherein the numerator summation unit and the denominator summation unit are simultaneously driven in parallel.

18. The disparity computation system through stereo matching based on census transform with an adaptive support weight according to claim 11, wherein the adaptive support weight is computed using a difference in a brightness value between a center pixel and other pixels of the adaptive support weight window.

19. The disparity computation system through stereo matching based on census transform with an adaptive support weight according to claim 11, wherein the adaptive support weight window and the matching window are sparse-type windows using only selected pixels in a window area.

20. The disparity computation system through stereo matching based on census transform with an adaptive support weight according to claim 11, wherein the adaptive support weight window and the matching window are different types of sparse-type windows.

* * * * *